US011322379B2

(12) United States Patent
Pan

(10) Patent No.: US 11,322,379 B2
(45) Date of Patent: May 3, 2022

(54) WAFER STORAGE BOX, WAFER TRANSFER DEVICE AND WAFER STORAGE AND TRANSFER ASSEMBLY HAVING THE SAME

(71) Applicant: DLY TECHNOLOGIES INC., Kaohsiung (TW)

(72) Inventor: Shih Feng Pan, Pingtung County (TW)

(73) Assignee: DLY Technologies Inc., Kaohsiung (TW)

( * ) Notice: Subject to any disclaimer, the term of this patent is extended or adjusted under 35 U.S.C. 154(b) by 0 days.

(21) Appl. No.: 17/344,515

(22) Filed: Jun. 10, 2021

(65) Prior Publication Data

US 2021/0391191 A1 Dec. 16, 2021

(30) Foreign Application Priority Data

Jun. 16, 2020 (TW) ................................. 109120229

(51) Int. Cl.
*H01L 21/677* (2006.01)
*H01L 21/673* (2006.01)
*H01L 21/683* (2006.01)

(52) U.S. Cl.
CPC ...... *H01L 21/6773* (2013.01); *H01L 21/6732* (2013.01); *H01L 21/67706* (2013.01); *H01L 21/67766* (2013.01); *H01L 21/67769* (2013.01); *H01L 21/67778* (2013.01); *H01L 21/6838* (2013.01)

(58) Field of Classification Search
None
See application file for complete search history.

(56) References Cited

U.S. PATENT DOCUMENTS 4,597,819 A * 7/1986 Kusuhara ................ H01L 21/67
118/500
5,735,662 A * 4/1998 Nichols ............. H01L 21/67778
211/1.57
6,293,749 B1 9/2001 Raaijmakers et al.
(Continued)

FOREIGN PATENT DOCUMENTS

| JP | 2004130459 A | 4/2004 |
| JP | 2008135630 A | 6/2008 |
| TW | I682484 B | 1/2020 |

*Primary Examiner* — Gerald McClain
(74) *Attorney, Agent, or Firm* — Muncy, Geissler, Olds & Lowe, P.C.

(57) ABSTRACT

A wafer storage box, wafer transfer device and wafer storage box and transfer assembly. The wafer storage and transfer assembly includes a chassis which is capable of translating or rotating, a sliding shaft, connecting levers, arms and at least two positioning sidewall. The chassis includes a groove. The sliding shaft can translate along the groove. The connecting levers are connected to the sliding shaft. Each arm extends from a connecting lever. The two positioning sidewall are respectively arranged on opposite sides of the chassis. Each positioning sidewall includes tracks accommodating the pins of connecting levers. The width of each of the tracks reduces from the front end of the positioning sidewall to the back end of the positioning sidewall. The wafer storage and transfer assembly can vacuum adsorb several wafers to achieve high efficiency of wafer storing and transferring.

9 Claims, 8 Drawing Sheets

(56) References Cited

U.S. PATENT DOCUMENTS

| | | | |
|---|---|---|---|
| 7,334,979 B2 * | 2/2008 | Chuang | H01L 21/67754 |
| | | | 414/331.16 |
| 8,277,165 B2 | 10/2012 | Tabrizi et al. | |
| 8,473,096 B2 | 6/2013 | Matsuo et al. | |
| 8,641,350 B2 | 2/2014 | De Ridder | |
| 8,950,998 B2 | 2/2015 | Van Der Meulen | |
| 9,245,784 B2 * | 1/2016 | Hashimoto | B25J 9/0084 |
| 9,343,344 B2 * | 5/2016 | Hashimoto | B25J 11/0095 |
| 9,878,453 B2 | 1/2018 | Bonora | |
| 10,062,594 B2 * | 8/2018 | Fukushima | H01L 21/67265 |
| 10,483,143 B2 * | 11/2019 | Hashimoto | H01L 21/67781 |
| 2001/0048867 A1 * | 12/2001 | Lebar | H01L 21/67201 |
| | | | 414/217 |
| 2014/0210224 A1 * | 7/2014 | Hashimoto | H01L 21/68707 |
| | | | 294/213 |

\* cited by examiner

WAFER STORAGE BOX, WAFER TRANSFER DEVICE AND WAFER STORAGE AND TRANSFER ASSEMBLY HAVING THE SAME

CROSS-REFERENCE TO RELATED APPLICATION

This application claims the priority benefit of Taiwan application no.109120229, filed 2020 Jun. 16. The entirety of each of the above-mentioned patent applications is hereby incorporated by reference herein and made a part of this specification.

TECHNICAL FIELD

The disclosure relates to a wafer storage and transfer assembly, and more particular to a wafer storage and transfer assembly which can reduce the size of a wafer storage and transfer assembly.

BACKGROUND

Wafer is a major material in the semiconductor manufacture. However, the wafer is fragile. Besides, it would cause huge loss that the wafer is polluted after photolithography. Therefore, the special designed cassette is needed to protect the wafer during being picked and transferred. Currently, the robot is used to pick and transfer the wafer between the cassette and wafer transportation system. Therefore, the interval of the rib is about 10 mm to match the production equipment. Therefore, the size of the cassette which stores 25 pieces of wafers is huge. Furthermore, it is low efficiency that robot just once picks and transfers one wafer between the cassette and the wafer transportation system. Even more, when the mass wafers are transported between fabs, the occupied volume, transportation time and transportation cost are considerable.

SUMMARY

Accordingly, the present disclosure provides a wafer storage and transfer assembly which can achieve high efficiency of storing and transferring the wafers and substantially reduce the size of the cassette for transporting the wafers.

The present invention has been made in view of the above problems. The present disclosure provides a wafer transfer device, comprising a chassis, a sliding shaft, arms, and at least two positioning sidewalls. The chassis is capable of transiting or rotating. The chassis comprises a groove which comprises a first end and a second end. One end of the sliding shaft is accommodated in the groove and the sliding shaft translates between the first end and the second end. The each connecting levers comprises a plate, a through hole formed in the plate and at least two pins extending from two opposite sides of the plate. The sliding shaft passes through the through hole and the connecting levers are connected to the sliding shaft. Each arm extends from one of the connecting levers. The two positioning sidewalls respectively arranged on two sides of the chassis. The groove is located between the at least two positioning sidewalls. An inner side of each positioning sidewall comprises fixing ribs and each two fixing ribs form a track which accommodates one of the pins. A width of each of the tracks reduces from a front end of the at least two positioning sidewalls to a back end of the at least two positioning sidewalls.

The present invention has been made in view of the above problems. The present disclosure provides a wafer storage box. A wafer storage box from or into which the above-mentioned transfer device comprises a upper plate, a lower plate, two side plates, a back plate, an accommodation region, an opening and a cassette. The accommodation region is formed by the upper plate, the lower plate, the two side plates and the back plate. The opening located at open end of the accommodation region. A cassette accommodated in the accommodation region. The left sidewall and the right sidewall of the cassette respectively comprises ribs and each two adjacent ribs form a slot. Each slot and each rib on the left sidewall are corresponding to each slot and each rib on the right sidewall.

The present invention has been made in view of the above problems. The present disclosure provides a wafer storage and transfer assembly comprising one of the above-mentioned transfer device and one of the above-mentioned storage box. The transfer device picks a wafer out and into the storage box.

Therefore, the size of the cassette can be reduced dramatically. Particularly, when the mass wafers are transported between fabs, the occupied size reduces to half. The wafer storage and transfer assembly comprises several arms so that it can vacuum adsorb several wafers. In comparison with current equipment which adsorb a wafer once a time, the transfer device can save time of vacuum adsorbing and transferring and achieve high efficiency of wafer storing and transferring.

DETAILED DESCRIPTION

Figure 1:
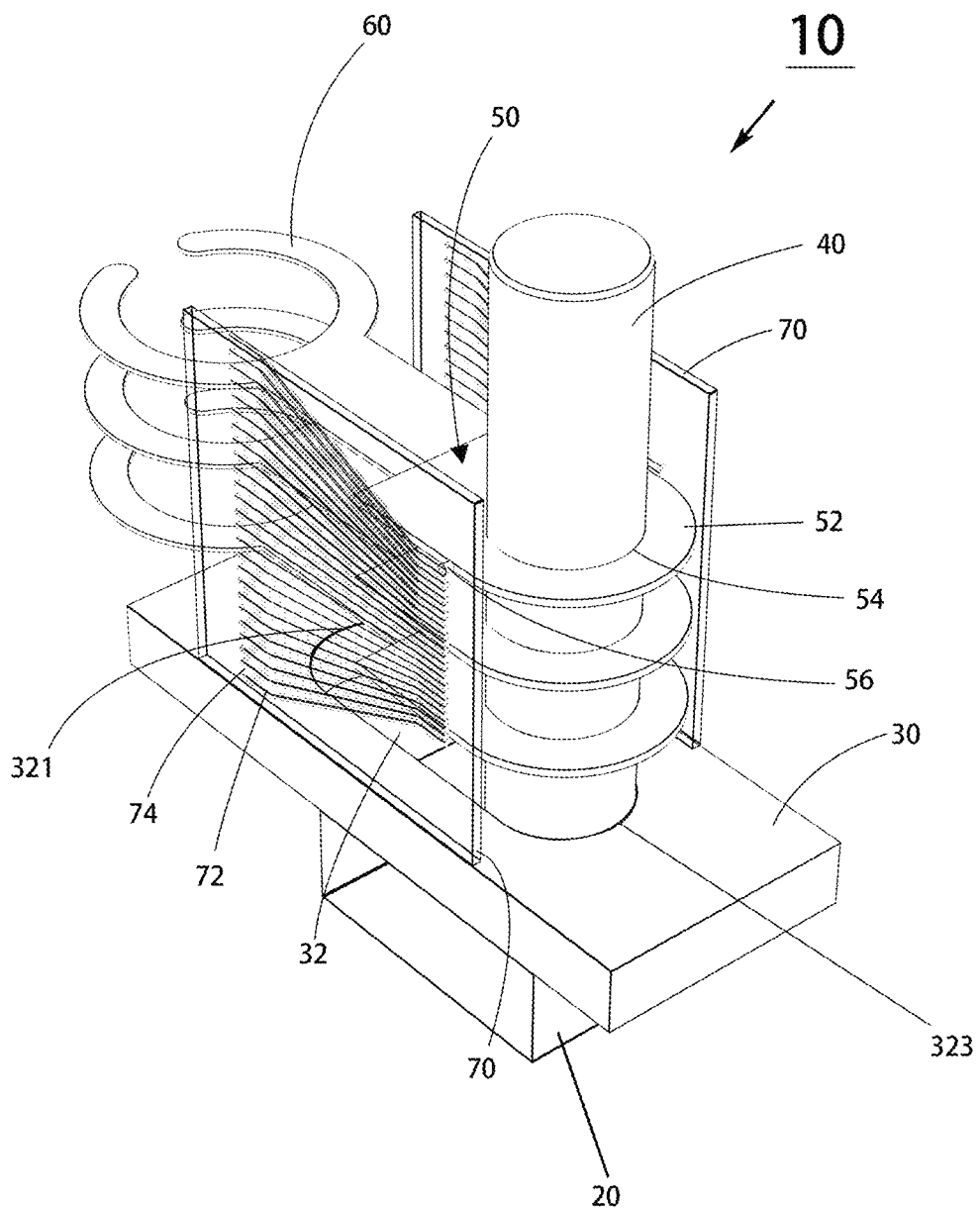
FIG. 1 is a schematic view of a wafer transfer device according to the first embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Some words are used to refer to specific elements in the whole specification and the appended claims in the disclosure. A person skilled in the art should understand that an wafer storage box and transfer device assembly manufacturer may use different names to refer to the same elements. The specification is not intended to distinguish elements that have the same functions but different names. In the following specification and claims, the terms "having", "including", etc. are open-ended terms, so they should be interpreted to mean "including but not limited to . . . ".

It should be noted that in the following embodiments, features in a plurality of embodiments may be replaced, recombined, or mixed to complete other embodiments without departing from the spirit of the disclosure. The features of the embodiments may be used in any combination without departing from the spirit of the disclosure or conflicting with each other.

FIG. 1 a schematic view of a wafer transfer device 10 according to the first embodiment of the disclosure. Referring to FIG. 1, a wafer transfer device 10 includes a fixed support 20, a chassis 30, a sliding shaft 40, connecting levers 50, arms 60 and two positioning sidewalls 70.

The chassis 30 is arranged on the fixed support 20. The chassis 30 is capable of translating or rotating relative to the fixed support 20. The chassis 30 includes a groove 32 which includes a first end 321 and a second end 323. In another embodiment, the fixed support 20 can be omitted or be replaced by another element, but the chassis 30 is still capable of translating or rotating.

One end of the sliding shaft 40 is accommodated in the groove 32 and the sliding shaft 40 translates between the first end 321 and the second end 323.

Each connecting levers 50 includes a plate 52, a through hole 54 which is formed in the plated 52, and two pins 56 extending from two opposite sides of the plate 52. The sliding shaft 40 passes through the through hole 54 and connecting levers 50 are connected to the sliding shaft 40. In this embodiment, a number of connecting levers 50 is twenty-five. In another embodiment, the number of the connecting levers depends on needs.

Each arm 60 extends from one end of a plate 52 of connecting levers 50. It should be noted that a number of the arms 60 is equal to a number of the connecting levers 50. In this embodiment, a number of the arms is twenty-five. Each arm can vacuum adsorb a wafer (as shown in FIG. 5).

Figure 2:
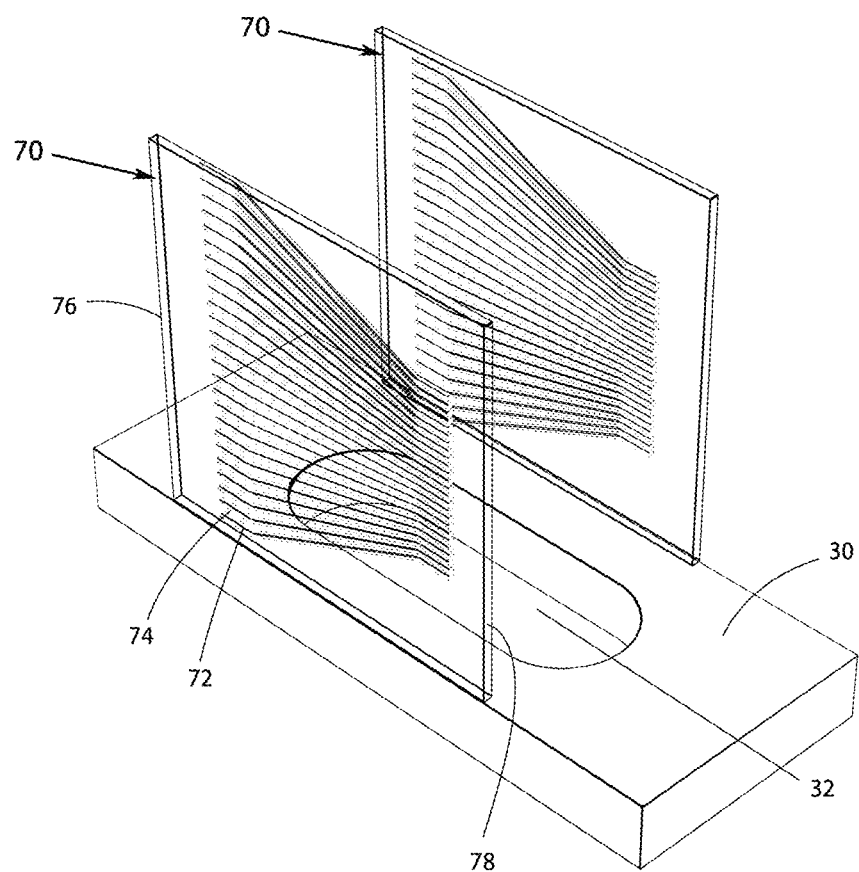
FIG. 2 is a schematic diagram of positioning sidewalls and a chassis according to the first embodiment of the disclosure.

Referring to FIG. 1 and FIG. 2, the two positioning sidewalls 70 are respectively arranged on two sides of the chassis 30. The groove 32 of the chassis 30 is arranged between the two positioning sidewalls 70. The inner side of each positioning sidewall 70 includes fixing ribs 72. Each two fixing ribs of the positioning sidewall 70 form a track 74 which accommodates a pin 56 of the connecting levers 50. A width of each of the tracks 74 reduces from a front end 76 of the at least two positioning sidewalls 70 to a back end 78 of the at least two positioning sidewalls 74. The width of each of the track 74 at the front end 76 of the positioning sidewall 70 is 10 mm and the width of each of the track 74 at the back end 78 of the positioning sidewall 70 is 5 mm. In another embodiment, the width of each of the track 74 at the front end 76 or at the back end 78 depends needs. For example, the width of each of the track 74 at the back end 78 is between 3 mm to 10 mm.

Figure 3:
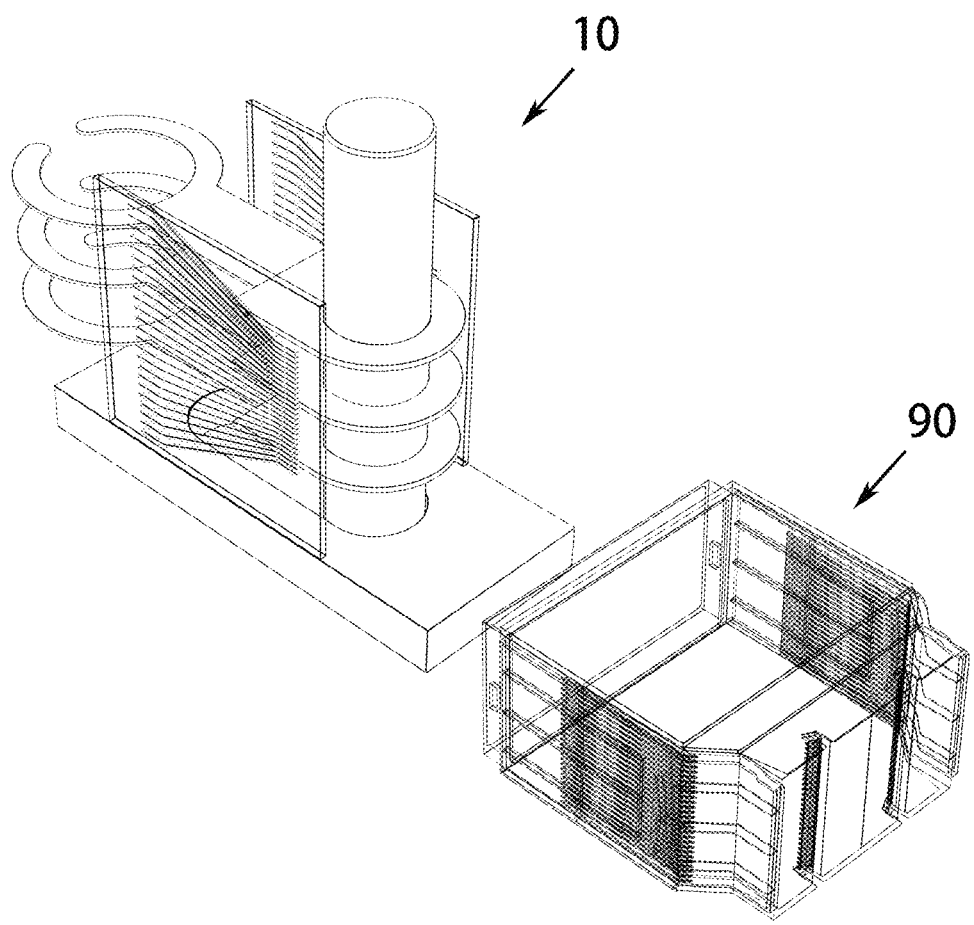
FIG. 3 is a schematic diagram of a wafer storage and transfer assembly according to the first embodiment of the disclosure.
Figure 4:
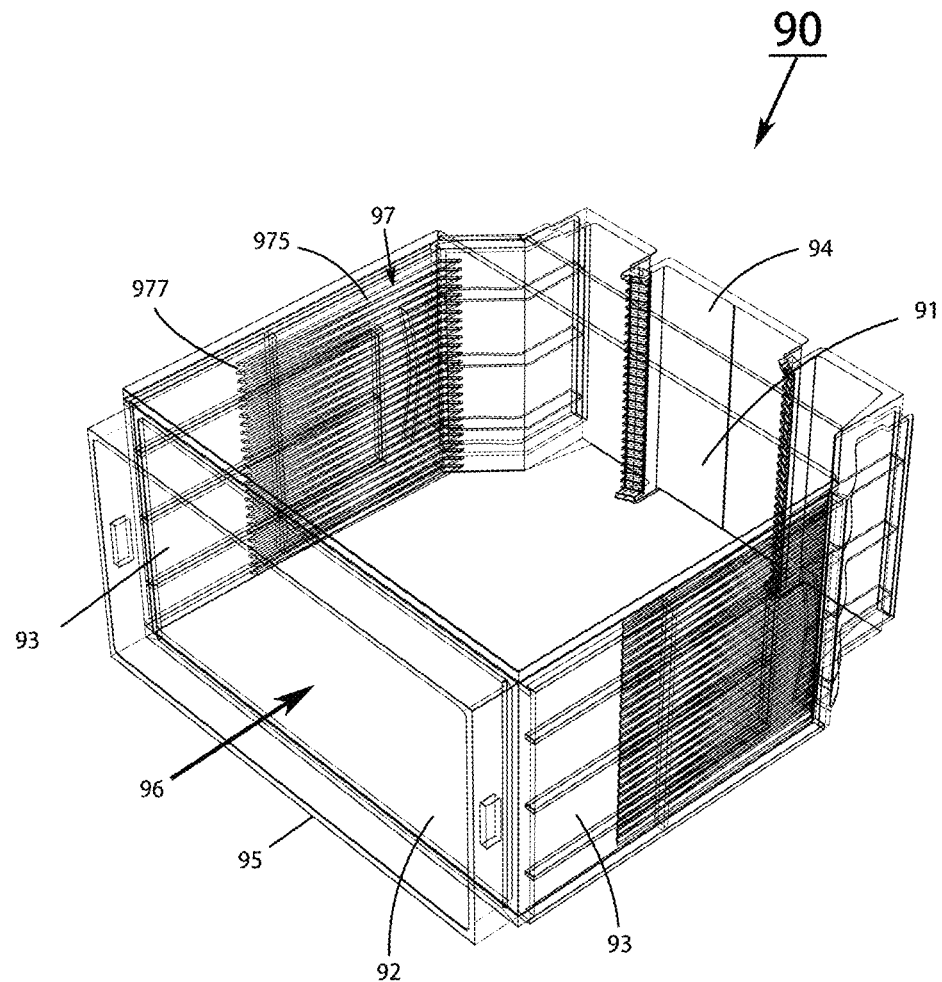
FIG. 4 is a schematic diagram of a wafer storage box according to the first embodiment of the disclosure.

Referring to FIG. 3, the wafer storage and transfer assembly 80 of the first embodiment includes one of the above-mentioned wafer transfer device 10 and a wafer storage box 90 from or into which the wafer transfer device 10 picks a wafer W. The wafer storage box 90 is substantially same as the conventional wafer storage box. As shown in FIG. 4, the storage box 90 includes an upper plate 91, a lower plate 92, two side plates 93, a back plate 94, an opening 95, an accommodation region 96 and a cassette. The accommodation region 96 is formed by the upper plate 91, the lower plate 92, two side plates and the back plate 94. The opening 95 is located at open end of the accommodation region 96. The cassette 97 is accommodated in the accommodation region 96. The cassette 97 includes ribs 975 on the two side plates 93. Each two adjacent ribs form a slot 977. The slot 977 on one side plate 93 is corresponding to another slot 977 on the other side plate 93. The slot 93 and another slot are for storage of a wafer W. In this embodiment, the difference between the storage box 90 and the conventional storage box is a width of the slot 977 and the width of the slot 977 is 5 mm. In another embodiment, a width of the slot depends on needs. For example, a width of each slot 977 can be ranged from 3 mm to 10 mm.

Figure 5:
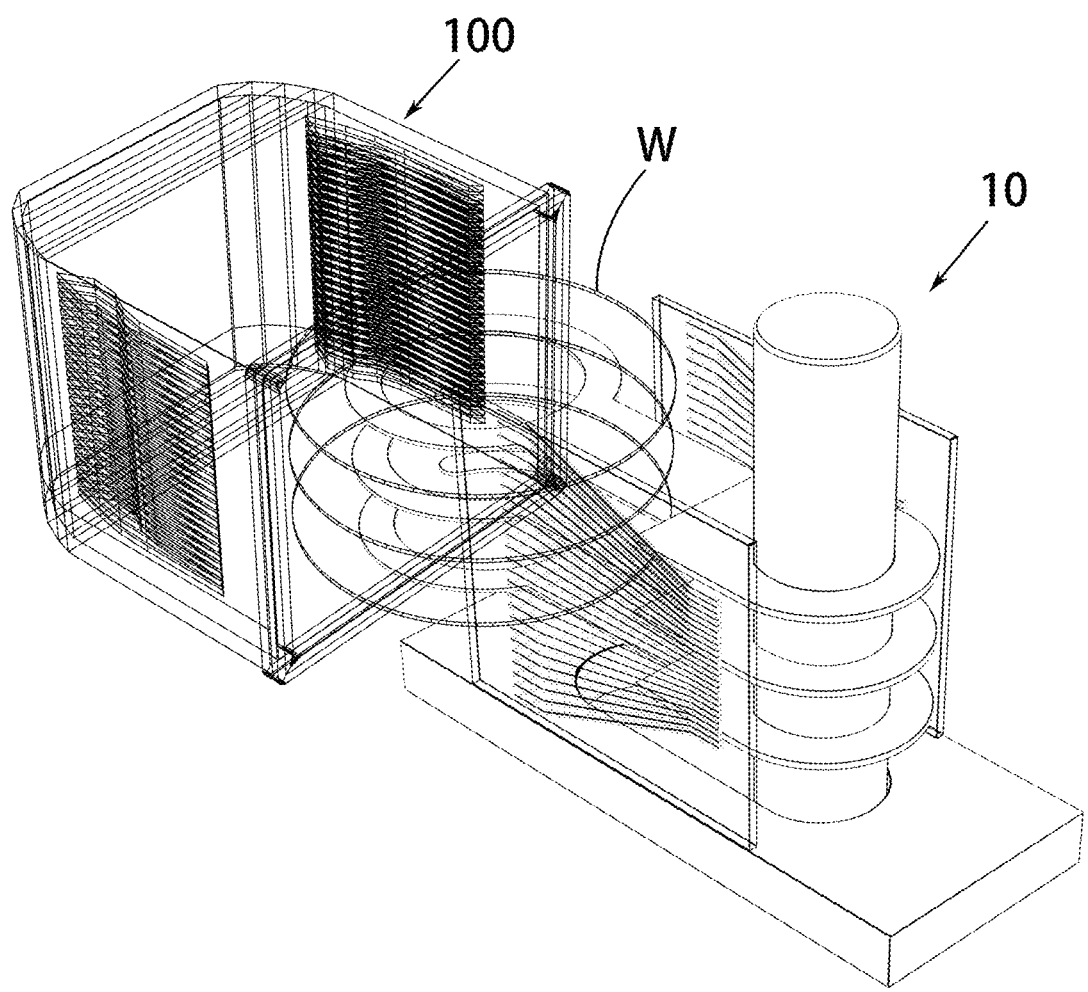
FIG. 5 is a schematic diagram of a conventional wafer storage box and a wafer transfer device according to the first embodiment of the disclosure.

Referring to FIG. 5, as shown on the left the cassette 100 is conventional and could be a wafer box or equipment. Therefore, the detail is not repeated herein. Conventional cassette can store 25 pieces of wafers and the distance between each two wafers is 10 mm. For convenience sake and streamlining figures, a number of wafers take 3 pieces as example. The following further explains the process that the wafer W transfer device 10 pick out from a conventional cassette and into the wafer storage box 90.

Figure 6:
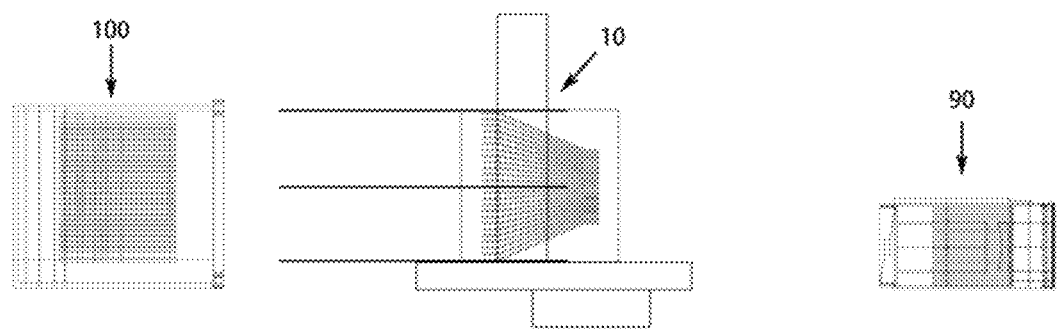
FIGS. 6, 7, 8, 9, 10, 11, 12 and 13 are action diagrams of a wafer transfer device according to the disclosure.
Figure 7:
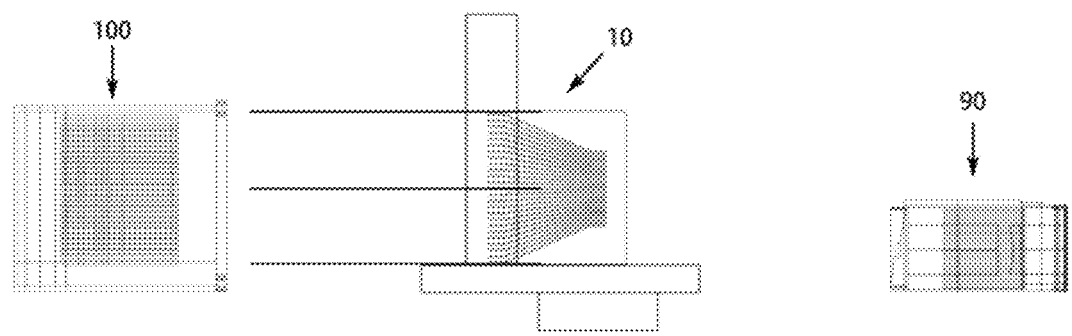
Figure 8:
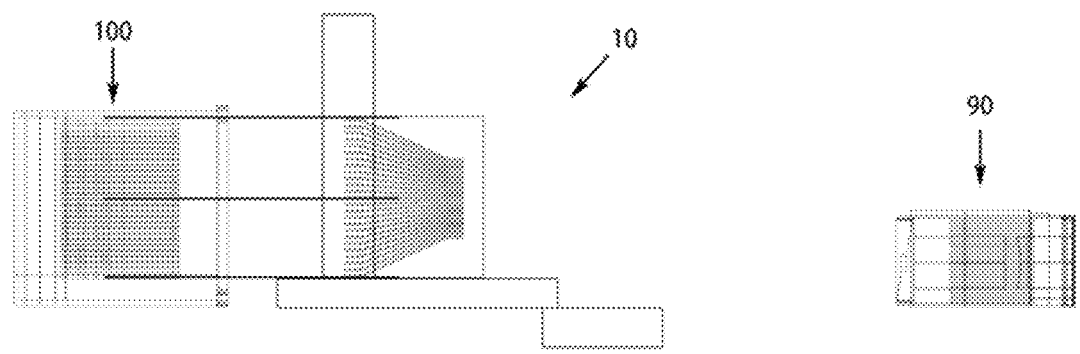
Figure 9:
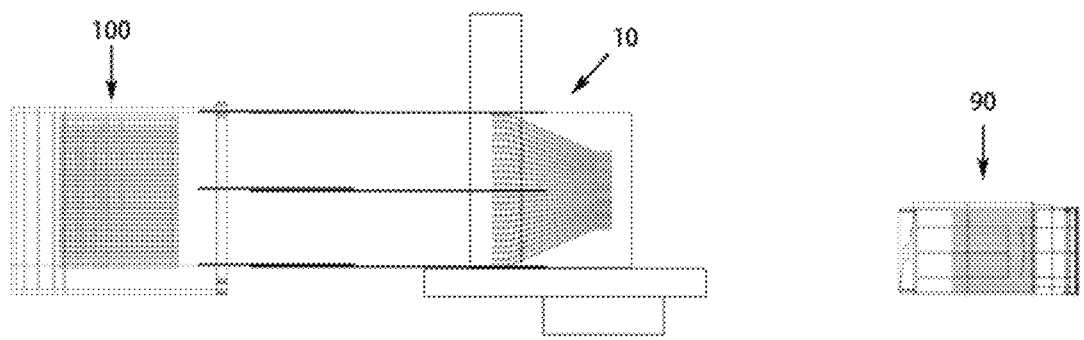
Figure 10:
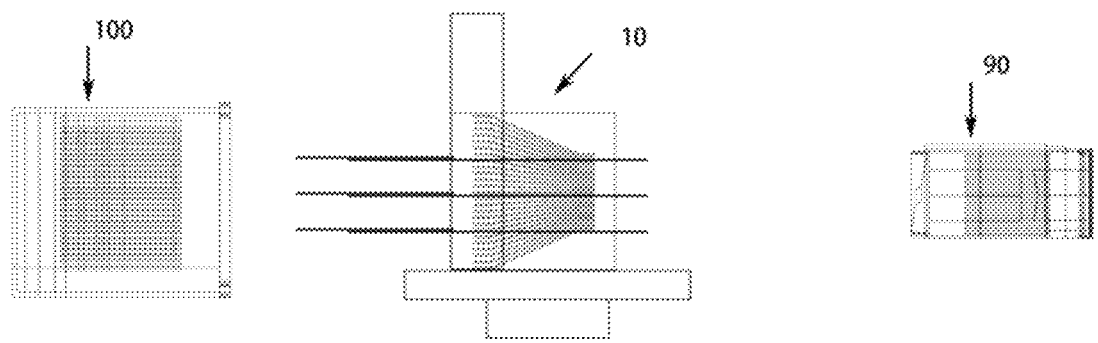

Going with the above-mentioned figures and referring to FIGS. 6, 7, 8, 9, 10, 11, 12 and 13, at first, the wafer transfer device 10 is positioned between a conventional cassette 100 and the wafer storage box 90 (as shown in FIG. 6). The first end 321 of the groove 32 of the chassis 30 is near to a conventional cassette 100 and the second end 323 of the groove 32 of the chassis is near to the wafer storage box 90. The slide shaft 40 begin to translate toward the first end 321 of the groove 32 and after the sliding shaft 40 reaching the first end 321 of the groove 32 (as shown in FIG. 7), the chassis 30 translates from an initial position toward the conventional cassette 100 (as shown in FIG. 8). When the sliding shaft 40 translates, the sliding shaft 40 drives the connecting levers 50 and the arms 60 to translate toward the conventional cassette 100. At the same time, two pins 56 of each connecting lever 50 respectively slide on the track 74. When the two pins 56 slide to near the front end 76 of the positioning sidewall 70 (That is to say, the sliding shaft 40 reaches the first end 321 of the groove 32), a distance between each two connecting levers is 10 mm to match the structure of the conventional cassette 100. Accompanied by the translating of the chassis 30, each arm 60 can move into the cassette 100 and vacuum adsorb a wafer W. Next, as shown in FIG. 9, the chassis 30 translates toward the wafer storage box 90 relative to the chassis 30. After the sliding shaft 40 go back to the initial position, the sliding shaft 40 translates toward the second end 323 along the groove 32. At the same time, the sliding shaft 40 drives the connecting levers 50 to translate toward the wafer storage box 90 and the arms 60 and the adsorbed wafer W go away from the conventional cassette 100. The sliding shaft 40 translates toward the second end 323, two pins 56 of each connecting lever 50 respectively slide on the track 74. Because a width of each of the track 74 reduces from the front end 76 of the positioning sidewall 70 toward the back end 78 of the positioning sidewall 70, therefore, the distance between wafers adsorbed by each arm 60 reduces. As shown in FIG. 10, when the two pins 56 slide to the back end 78 of the positioning sidewall 70 on the track 74 (that is each sliding shaft 40 reaches the second end 323 of the groove 32), a distance between each two connecting levers is 5 mm. That is, a distance between each two wafers is 5 mm.

Figure 11:
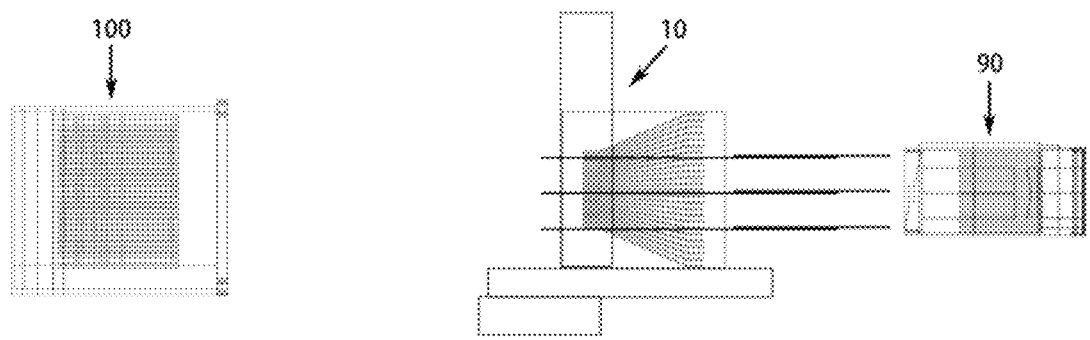

According to FIG. 11, the chassis 30 rotates 180 degree relative to the fixing support 20 so that the wafers W adsorbed by the arms faces the opening 95 of the storage box 90. At this time, the second end 323 of the groove 32 is near the conventional cassette 100 and the first end 321 of the groove 32 is near the storage box 90. After the rotating of the chassis 30, the position of chassis relative to the fixing support 20 translates toward the storage box 90. It should be noted that the sliding shaft 40 still stays at the second end 323 of the groove 32 and not slides toward the first end 321. Therefore, the distance between each of the wafers keeps 5 mm.

Figure 12:
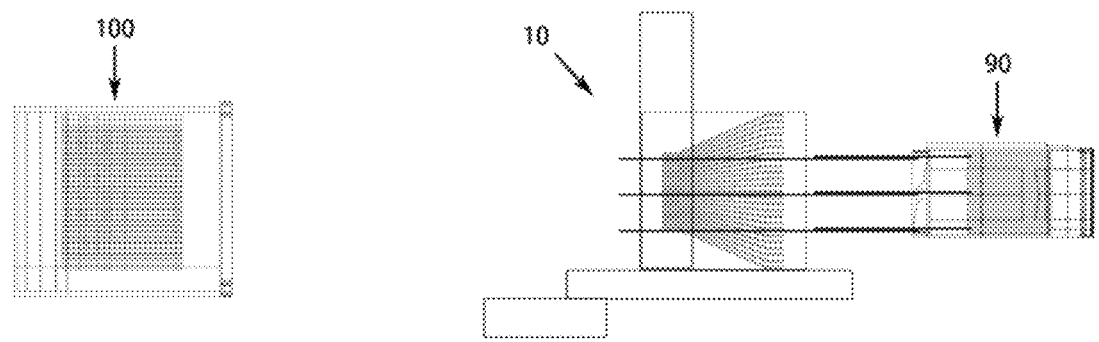
Figure 13:
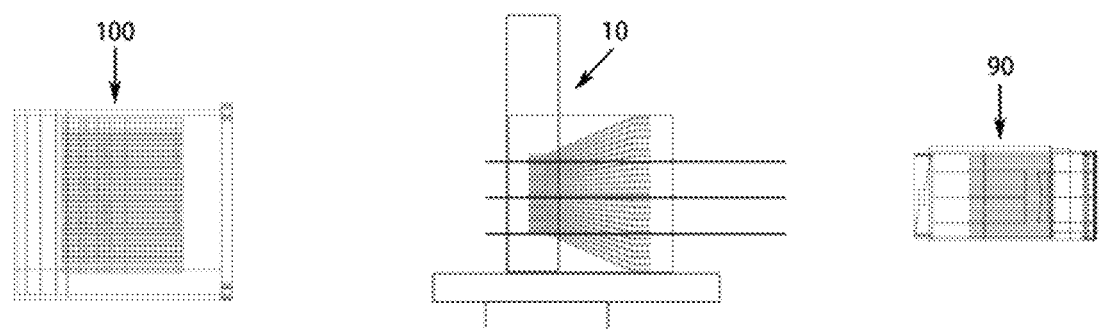

The chassis 30 drives the sliding shaft 40 to translate the wafer storage box 90 accompanied by the translating of the chassis 30. At the same time, the chassis 30 drives the connecting levers 50, arms 60 and wafers W translate toward to the wafer storage box 90 until the arms reach into the wafer storage box 90. As shown in FIG. 12, the wafer W is placed in the corresponding slot 977 so that the chassis 30 can translate away from the wafer storage box 90 relative to the fixing support 20 and drives the arms 60 to go away from the wafer storage box 90. As shown in FIG. 13, the process of picking wafers W from the conventional cassette 100 into the wafer storage box 90 by the wafer transfer device 10 is finished.

Because a width of each slot 977 of the wafer storage box 90 is 5 mm, a distance between each two wafers W is just 5 mm. Therefore, in contrast to the conventional structure, a size of the wafer storage box which stores 25 pieces of wafers can reduce half. Particularly, when the mass wafers are transported between fabs, the occupied size reduces to half. Besides, because a width of each of the track 74 of the positioning sidewall 70 reduces from the front end 76 to the back end 78, the wafer transfer device 10 can pick wafers W out or into the wafer storage box 90. And then the wafer transportation is performed by the wafer storage box 90. In other words, the wafer transfer device 10 can reduce a width between wafers from 10 mm to 5 mm dramatically. It is easy and not complex to achieve the effect of reduce the size of the wafer storage box. On the other hand, because the wafer transfer device includes arms, in more detail, the wafer transfer device 10 includes twenty five arms 60, it can transfer 25 pieces wafers at the same time. The conventional robot just adsorbs a wafer once a time. By comparison, the wafer transfer device 10 spends less time to adsorb and transfer wafers and achieve high efficiency wafer storing and transferring. Furthermore, the wafer transfer device 10 can transfer elements other than semiconductor wafers or be applied to another field. For example, the wafer transfer device 10 can transfer disc, mask or glass substrate which is applied in display field and not limited to the semiconductor wafer.

Figure 14:
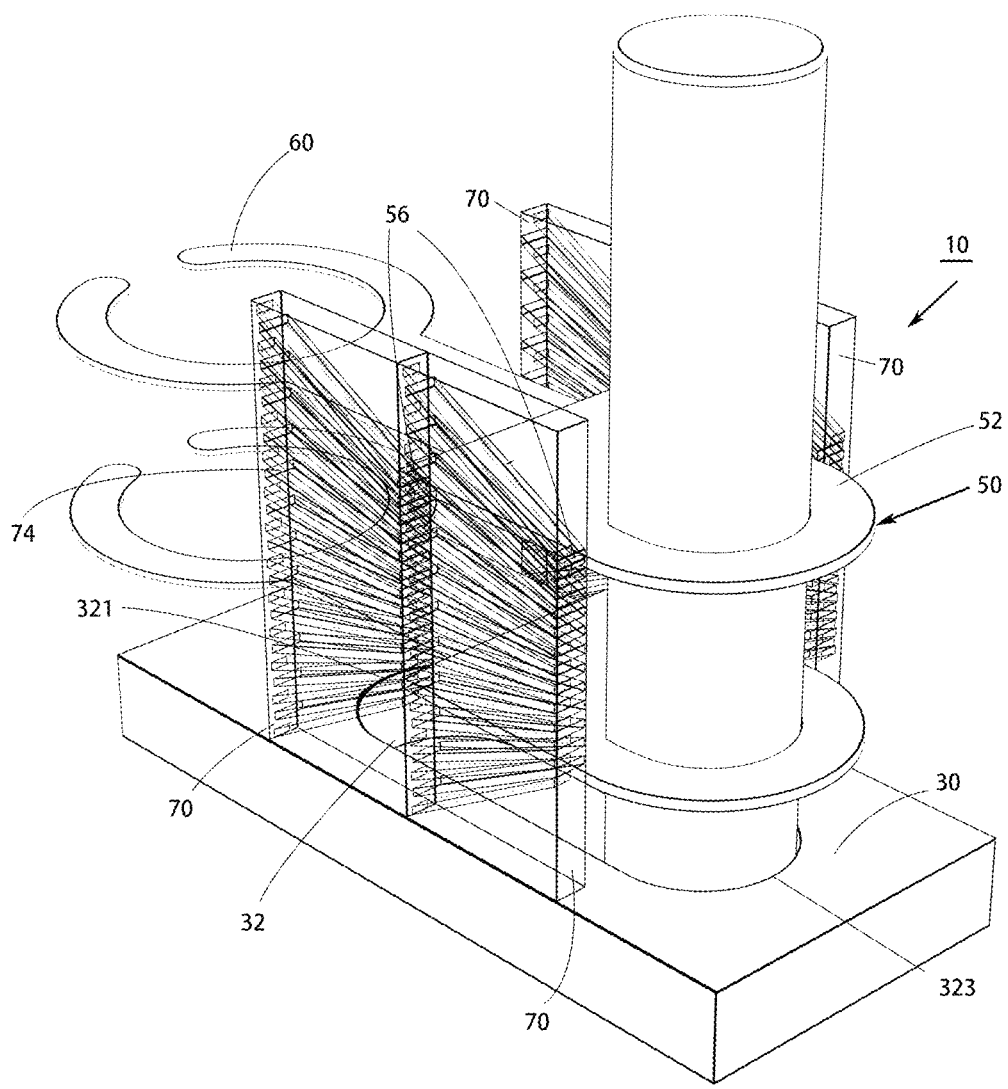
FIG. 14 is a schematic diagram of a wafer transfer device according to the second embodiment of the disclosure.

According to the concept of the invention, the structure of the wafer transfer device can be modified. For example, referring to FIG. 14, the wafer transfer device 10' is the second embodiment of the invention. A structure of the wafer transfer device 10' is substantially same as the wafer transfer device 10 disclosed in the first embodiment, except that the wafer transfer device 10' includes four positioning sidewalls 70. Each two positioning sidewall 70 are respectively arranged on two side of the chassis 30 and the connecting levers includes four pins. Each two pins 56 extend from two opposite sides of the plate 52. Four pins 56 of each connecting lever 50 respectively extend into the corresponding track 74 on the four positioning sidewalls. Therefore, when the sliding shaft 40 translates from the first end 321 of the groove 32 toward the second end 323 of the groove 32, each connecting lever can be more stable.

Although the disclosure has been described in detail with reference to the foregoing embodiments, a person of ordinary skill in the art should understand that modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

The invention claimed is:

1. A wafer transfer device, comprising:
   a chassis, being capable of transiting or rotating and comprising a groove which comprises a first end and a second end;
   a sliding shaft, wherein one end of the sliding shaft is accommodated in the groove and the sliding shaft translates between the first end and the second end;
   connecting levers, each of the connecting levers comprising a plate, a through hole formed in the plate and at least two pins extending from two opposite sides of the plate, wherein the sliding shaft passes through the through hole and the connecting levers are connected to the sliding shaft;
   arms, each of the arms extending from one of the connecting levers; and
   at least two positioning sidewalls respectively arranged on two sides of the chassis, wherein the groove is located between the at least two positioning sidewalls, a inner side of each of the positioning sidewalls comprises fixing ribs, each two of the fixing ribs form a track which accommodates one of the pins, and a width of each of the tracks reduces from a front end of the at least two positioning sidewalls to a back end of the at least two positioning sidewalls.

2. The transfer device of claim 1, wherein the width is about 10 mm at front end of the at least two positioning sidewalls and the width is ranged from 3 mm to 10 mm at back end of the at least two positioning sidewalls.

3. The wafer transfer device of claim 2, wherein the width is about 5 mm at back end of the at least two positioning sidewalls.

4. The wafer transfer device of claim 1, wherein two of the at least two positioning sidewalls are respectively arranged on opposite sides and the other two of the at least two positioning sidewalls are respectively arranged on the other opposite sides.

5. The wafer transfer device of claim 4, wherein each of the connecting levers comprises four pins and each of the two pins extend from two opposite sides of the plate.

6. A wafer storage box from or into which the wafer transfer device of claim 1 picks a wafer, comprising:
   an upper plate;
   a lower plate;
   two side plates;
   a back plate;
   an accommodation region formed by the upper plate, the lower plate, the two side plates and the back plate;
   an opening located at open end of the accommodation region; and
   a cassette accommodated in the accommodation region, wherein the left side plate and the right side plate respectively comprises ribs, each of two adjacent ribs form a slot, each of the slots and each of the ribs on the left side plate is corresponding to each the slot and each the rib on the right side plate.

7. The wafer storage box of claim 6, wherein a width of each of the slots is ranged from 3 mm to 10 mm.

8. The wafer storage box of claim 7, wherein a width of each of the slots is about 5 mm.

9. The wafer storage and transfer assembly for transferring a wafer, comprising
   the transfer device of claim 1; and
   a wafer storage box from or into which the wafer transfer device picks a wafer, comprising:

an upper plate;
a lower plate;
two side plates;
a back plate;
an accommodation region formed by the upper plate, the lower plate, the two side plates and the back plate;
an opening located at open end of the accommodation region; and
a cassette accommodated in the accommodation region, wherein the left side plate and the right side plate respectively comprises ribs, each of two adjacent ribs form a slot, each of the slots and each of the ribs on the left side plate is corresponding to each the slot and each the rib on the right side plate;
wherein the transfer device picks a wafer from or into the wafer storage box.

* * * * *